(12) United States Patent
Westergaard

(10) Patent No.: US 7,639,822 B2
(45) Date of Patent: Dec. 29, 2009

(54) METHOD OF PROGRAMMING A HEARING AID BY A PROGRAMMING DEVICE

(75) Inventor: Anders Westergaard, Herlev (DK)

(73) Assignee: WIDEX A/S, Vaerlose (DK)

( * ) Notice: Subject to any disclaimer, the term of this patent is extended or adjusted under 35 U.S.C. 154(b) by 412 days.

(21) Appl. No.: 11/226,348

(22) Filed: Sep. 15, 2005

(65) Prior Publication Data

US 2006/0008102 A1 Jan. 12, 2006

Related U.S. Application Data

(63) Continuation-in-part of application No. PCT/DK2003/000189, filed on Mar. 19, 2003.

(51) Int. Cl.
*H04R 29/00* (2006.01)
(52) U.S. Cl. .......................... 381/60; 381/314; 381/323
(58) Field of Classification Search ................ 381/312, 381/314, 323, 60; 710/8; 320/114, 132, 320/134, 148, 152; 395/195, 196; 365/201
See application file for complete search history.

(56) References Cited

U.S. PATENT DOCUMENTS

| | | | | |
|---|---|---|---|---|
| 4,049,930 A | * | 9/1977 | Fletcher et al. | 381/60 |
| 4,392,101 A | * | 7/1983 | Saar et al. | 320/156 |
| 4,771,399 A | * | 9/1988 | Snowden et al. | 365/226 |
| 4,926,174 A | * | 5/1990 | Fiori, Jr. | 341/110 |
| 4,989,251 A | * | 1/1991 | Mangold | 381/314 |
| 5,610,506 A | * | 3/1997 | McIntyre | 323/313 |
| 5,706,351 A | * | 1/1998 | Weinfurtner | 381/314 |
| 5,734,964 A | * | 3/1998 | Fishman et al. | 455/42 |
| 6,115,478 A | * | 9/2000 | Schneider | 381/314 |
| 6,166,960 A | * | 12/2000 | Marneweck et al. | 365/185.28 |
| 6,704,424 B2 | * | 3/2004 | Killion | 381/323 |
| 6,931,141 B2 | * | 8/2005 | Moller | 381/323 |
| 7,054,957 B2 | * | 5/2006 | Armitage | 381/314 |
| 7,142,895 B2 | * | 11/2006 | Heatley | 455/574 |

(Continued)

FOREIGN PATENT DOCUMENTS

DE 100 05 428 A1 8/2001

(Continued)

OTHER PUBLICATIONS

Sheingold, Daniel H.; "Analog-Digital Conversion Handbook"; 1986; Prentice Hall; pp. 212-213, 216-218.*

*Primary Examiner*—Curtis Kuntz
*Assistant Examiner*—Ryan C Robinson
(74) *Attorney, Agent, or Firm*—Sughrue Mion, PLLC

(57) ABSTRACT

A battery-powered hearing aid (1) is programmed via a programming device (2), the hearing aid (1) having a battery (11) and a line connection (3, 4) for connecting the battery (11) to the programming device (2). The programming device uses a variable voltage source (5) and an input comparator (6) with a first and a second input terminal and an output terminal to output a variable voltage to one input of the input comparator (6) and determining the voltage of the hearing aid battery (11) by using the second input of the input comparator (6) of the programming device (2). By ramping the output of the variable voltage source (5) used as a reference, the voltage of the battery (11) can be determined with great accuracy using existing hearing aid programming circuitry.

10 Claims, 3 Drawing Sheets

U.S. PATENT DOCUMENTS

| | | | |
|---|---|---|---|
| 7,242,777 B2 * | 7/2007 | Leenen et al. | 381/60 |
| 2002/0094098 A1 * | 7/2002 | Delage | 381/312 |
| 2006/0256989 A1 * | 11/2006 | Olsen et al. | 381/323 |

FOREIGN PATENT DOCUMENTS

| | | | |
|---|---|---|---|
| EP | 0537026 A2 * | 10/1992 | |
| EP | 1 276 349 A1 | 1/2003 | |
| JP | 63-16279 A | 1/1988 | |
| JP | 3-2682 A | 1/1991 | |

\* cited by examiner

METHOD OF PROGRAMMING A HEARING AID BY A PROGRAMMING DEVICE

The present application is a continuation-in-part of application No. PCT/DK2003/000189, filed on Mar. 19, 2003, in Denmark and published as WO 2004/084581 A1.

BACKGROUND OF THE INVENTION

1. Field of the Invention

This invention relates to the programming of hearing aids. More specifically, it relates to the programming of hearing aids having means for communication with a programming device.

2. The Prior Art

Known programmable hearing aids utilize non-volatile memories such as an EEPROM (electrically erasable programmable read only memory) to store parameter data determining the function of the hearing aid. In some types of programmable hearing aids, the necessary voltage for programming the hearing aid may supersede the voltage level available from the hearing aid battery, typically 1.3 V-1.35 V. Some programmable hearing aids are powered by the programming device during programming, while others draw power from the internal battery. In the latter case, the condition of the battery is critical, especially during programming.

With regard to the invention, the term 'programming' relates to the process of reading information regarding the adjustable settings in the hearing aid from the hearing aid to the programming device for verification, and writing changes in these data back to the hearing aid for the purpose of changing the adjustments of the hearing aid to suit the particular user of the hearing aid. These settings define the way the hearing aid is supposed to operate. The programming is an interactive process involving both a hearing aid user and a fitter, and is usually performed by the fitter operating a programming device connected to the hearing aid while the user is wearing the hearing aid, allowing the user to immediately experience changes in the hearing aid settings made through the programming.

In a programmable hearing aid, different parameter data determining the audio processing in the hearing aid can be preprogrammed into the hearing aid processor for later retrieval. The data are usually transferred to the hearing aid as binary data via a serial communications link, and are stored in a non-volatile memory in the hearing aid. The binary data may, electrically, be defined as a series of switchings between two voltage levels that are clearly distinguishable to a comparator in a programming device, for instance, zero volts and the battery voltage, respectively. Furthermore, the hearing aid may be capable of transmitting the contents of the parameter data registers, or other data regarding the state, type or identity of the hearing aid, back to the programming device.

In order to send or receive digital data the hearing aid processor may utilize a buffered, bi-directional UART (Universal Asynchronous Receiver Transmitter), capable of sending or receiving digital data in a serial fashion via one or more data lines. In the case of a hearing aid that is intrinsically powered during the process of the programming device communicating with the hearing aid, the hearing aid draws its energy from an internal battery, that supplies the circuitry of the hearing aid with power. For the purpose of programming hearing aids where the battery is disconnected from the hearing aid circuitry during programming, for example hearing aid types having the programming terminals positioned in the battery compartment due to space constraints in the hearing aid, the programming device has a variable voltage source for external powering of hearing aids of this type during programming.

Programming of a hearing aid usually begins with the programming device sending a sequence of control bits, also denoted a data telegram, to the hearing aid, requesting a data readout of the first memory bank in the hearing aid. The hearing aid responds with a sequence of data bits reflecting the contents of the hearing aid memory. These data are received by the programming device, which may, from then on, limit writing of any subsequent data to the hearing aid to those changes required for effecting changes in the initial settings. In some cases, the communication sequence may be initiated from the hearing aid, however, the basic exchange of data is the same.

Writing into the non-volatile memory is a power consuming and critical operation. The power made available to the hearing aid has to be sufficient for the hearing aid to be able to store the received data in the data registers of the hearing aid safely. If the battery is new, this does not pose a real problem, as the battery of the hearing aid is designed for powering normal operation during data write sequences. If, however, the capacity of the battery is lower than is the case when the battery is new, the residual capacity of the battery may reach a point where it may still be sufficient for powering normal operation of the hearing aid processor, but insufficient for powering to the operation of storing the received data during data write sequences, thus incurring the risk of data loss during programming.

U.S. Pat. No. 4,049,930 discloses a hearing aid malfunction detection system which, among other functions, monitors the hearing aid battery periodically during use. If a malfunction in the hearing aid circuitry occurs during operation, the user has to reset the hearing aid or change the battery to restore normal operation.

Within the art of electronics, the measurement of an unknown voltage by using a comparator and a well-known, variable voltage has been suggested, e.g. as known within the field of digital voltmeters. In principle, the digital voltmeter operates by applying a predetermined voltage to one terminal of a comparator and an unknown voltage to another terminal of the same comparator, and then changing the predetermined voltage in a predictable way and monitoring the instant when the comparator output changes.

In the light of the foregoing, there is a need for a method of estimating the battery voltage of a programmable hearing aid and for providing this information to the fitter in a safe and easy way, preferably without making any additional connections to the hearing aid.

The method according to the invention comprises the steps of electrically connecting to the first input of the comparator of the programming device the terminal of the hearing aid, applying by means of the voltage source of the programming device a probe voltage different from the expected battery voltage of the hearing aid to the second input of the comparator, monitoring the level of the output terminal of the comparator, ramping the probe voltage up or down until the comparator output terminal level changes, and determining the battery voltage as the probe voltage at which the comparator output change was detected.

By applying a voltage different from, e.g. higher than, the hearing aid battery voltage to the second input terminal of the comparator, the level of the communication line appears as a logical low level to the programming device. The comparator output terminal changes state when the applied voltage is ramped downwards until it crosses the level of whichever voltage is present on the communication line, e.g. the battery voltage or a voltage derived therefrom. The applied voltage is then compared to a predetermined voltage range deemed suitable for safe programming of the hearing aid, and a decision regarding sufficiency or insufficiency of the battery voltage is taken.

The invention, in a second aspect, provides a method of programming a hearing aid, comprising the steps of providing a line connection for connecting the hearing aid to a programming device; providing in the programming device a variable voltage source and an input comparator; connecting a first input terminal of the input comparator to the voltage source; connecting a second input terminal of the input comparator to the line connection; controlling the voltage source to output a voltage that varies according to a predetermined pattern; determining by the programming device the instant of a change at an output of the input comparator; and determining by the programming device as the value of the battery voltage the current value of the voltage source output voltage; and writing programming data to the hearing aid.

Particular embodiments of the invention appear from the dependent claims.

BRIEF DESCRIPTION OF THE DRAWINGS

The invention will now be described in greater detail with reference to the drawings, where:

FIG. 1 shows a programmable hearing aid 1 connected to a programming device 2 via a communication line 3 and a ground line 4. A hearing aid battery 11 supplies the circuitry of the hearing aid 1, comprising a communication output buffer 8, a communication input buffer 9, one or more microphones (not shown), an output transducer (not shown) and a hearing aid processor 10. The hearing aid battery 11 is also connected to the ground line 4, and to the communication line 3 via the pull-up resistor 7.

Figure 1:
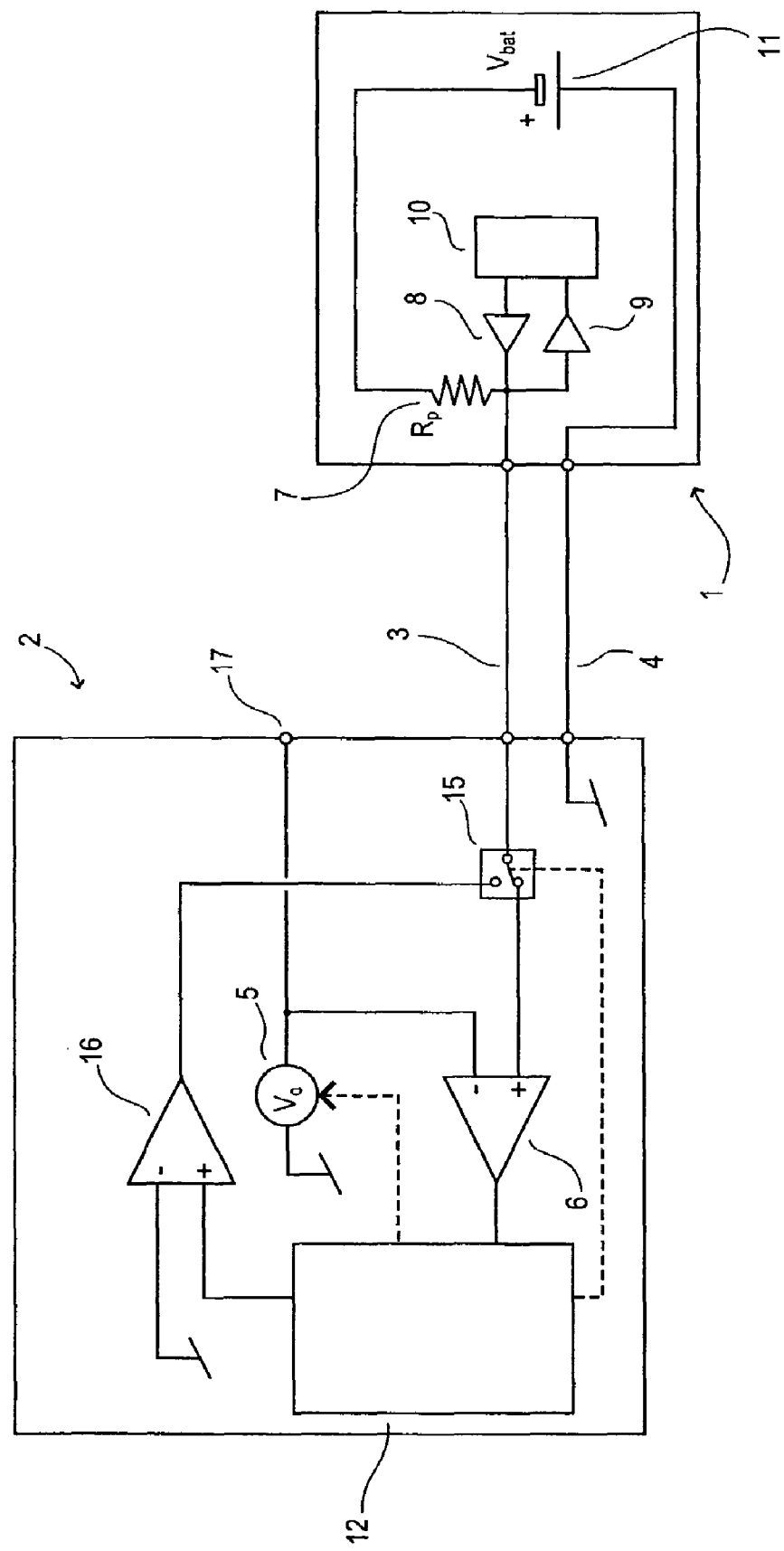
FIG. 1 is a schematic block diagram of a hearing aid connected to a programming device.

The programming device 2 comprises an independent voltage source 5, a control unit 12, an input comparator 6, acting as an input detector, and an output comparator 16, acting as a line driver. The independent, variable voltage source is generally included in the programming device for providing a capability of externally powering a hearing aid during programming. This allows programming of such hearing aids where the hearing aid battery is shut off from the hearing aid when the hearing aid is connected to the programming device. While powering an intrinsically powered hearing aid, the variable voltage source is in fact available to be put to use according to the inventive method. The independent voltage source 5 is connected to the reference input of the input comparator 6 and to a power supply terminal 17.

The output of the input comparator 6 is connected to the data input line of the control unit 12, and a data output line of the control unit 12 is connected to the input of the output comparator 16. A controlled switch 15 is provided for switching between two primary function modes, read mode and programming mode.

In read mode, serial data read out from the hearing aid 1 is presented to the control unit 12 via an input of the comparator 6 and the controlled switch 15. In programming mode, serial data from the control unit 12 is read out via the comparator 16 and the controlled switch 15 to the input of the hearing aid 1.

The hearing aid 1 is put in an idle state initially when connected to the programming device 2, anticipating communication. The output buffer 8 and the input buffer 9 is in an 'open collector'-, or high impedance, mode in this state, and they practically draw no current via the pull-up resistor 7. Thus, the voltage between the communication line 3 and the ground line 4 equals the voltage $V_{bat}$ of the hearing aid battery 11. The programming device 2 may, optionally, be configured with a selection of input resistors (not shown), enabling the use of a current loop in the communication path to facilitate communication with the hearing aid 1. In many cases, however, a high-impedance (high-Z) configuration of the programming device 2 is preferred to minimize the current drawn from the hearing aid battery 11 during programming.

The voltage source 5 generates on the reference input of the input comparator 6 the voltage $V_o$. The battery voltage $V_{bat}$ is measured in the following way: To the negative reference terminal of the input comparator 6 a voltage $V_o$ significantly higher than the expected voltage of the battery 11 is applied. As the voltage on the line 3, equal to the battery voltage $V_{bat}$, at this stage is significantly lower than the reference voltage $V_o$, the output level of the comparator 6 is a logical LOW. The control unit then ramps the voltage $V_o$ downwards, while the output of the input comparator 6 is monitored. This downwards ramping of the voltage $V_o$ continues until it is equal to, or decrementally lower than, the voltage on the line 3, equal to voltage $V_{bat}$ of the battery 11. This causes the logical output of the input comparator 6 to change to a logical HIGH level. This change is detected by the control unit 12 of the communication device 2 which records the current value of the voltage $V_o$, signifying the battery voltage as measured.

The recorded value of the voltage $V_o$ is compared to a range deemed suitable for powering the hearing aid during a programming session. If the voltage level of the hearing aid battery 11 is too low, the control unit 12 will initiate a message to the operator of the communication device 2 regarding this condition, and programming may be prevented until the battery 11 has been changed and the hearing aid battery 11 tested again with a satisfactory result.

A programming sequence may be structured in this way: First, the hearing aid 1 is connected to the programming device 12 using a suitable cable having two or more separate leads 3, 4. Then, a data telegram requesting the hearing aid 1 to return the contents of its first memory bank (not shown) is sent from the programming device 12 to the hearing aid 1. The first memory bank in a programmable hearing aid contains, apart from the first accessible program, the make, model and serial number of the hearing aid 1. If the hearing aid 1 responds to this data telegram by returning recognizable data, the programming device 12 collects this data telegram and indicates that the hearing aid is 1 present and operational.

As one result of this test the contents of the first memory bank of the hearing aid 1 is now duplicated in the programming device 12. Subsequent programming entries may thus be limited to changes in single parameters in the hearing aid 1 only, without altering the other parameters.

According to current standard procedures for programming programmable hearing aids, the contents of the first memory bank comprises information of the make and model of the hearing aid in question, and this information may be used to derive the memory addresses for subsequent memory banks, should the need to address those memory banks arise.

Now, the programming device 12 tests the battery voltage level of the hearing aid 1 as explained above. When the battery 11 of the hearing aid 1 has passed the test and the battery voltage is deemed acceptable, the program(s) for acoustic processing in the hearing aid 1 may be altered by the data telegrams sent to it from the programming device 12. After reception of each data telegram, the hearing aid 1 responds with an acknowledge data telegram. The voltage level test may be carried out at any time as long as the hearing aid 1 is connected to the programming device 12, and may also be used to detect the presence of a hearing aid.

Figure 2:
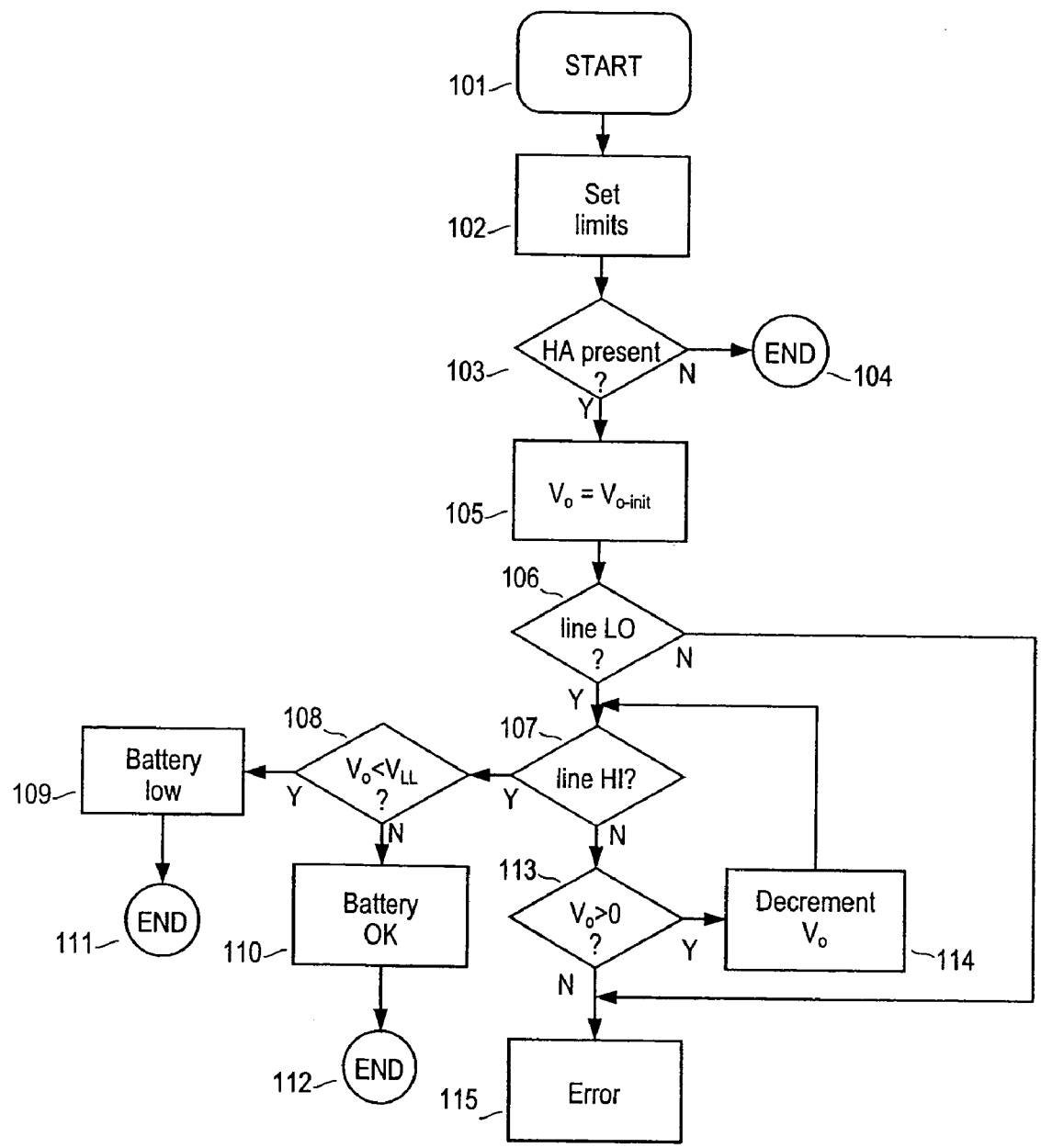
FIG. 2 is a flowchart of an algorithm able to perform the steps of the method according to the invention.

The flow chart in FIG. 2 illustrates the structure of a software routine executed in the control unit 12 of the communication device 2 in FIG. 1, and is a practical implementation of the method according to the invention. The routine begins in step 101 by allocating memory etc. to perform the measurement, and proceeds to step 102, where the actual measurement limits are defined. These limits depend on the actual electrical configuration of the particular hearing aid/communication device configuration.

In step 103, a test is performed to verify that a hearing aid is actually present at the end of the communication line 3. If no hearing aid is detected, the routine proceeds to step 104 prompting to the main program to display a message that a hearing aid must be connected properly to perform the measurement and subsequent programming, whereafter the routine is terminated. If a hearing aid is detected, the routine continues in step 105 by applying a high output voltage $V_o$, higher than a predetermined upper voltage level $V_{UL}$, on the negative input of the input comparator 6 in the communication device 2, which has the effect of making the voltage level of the communication line 3 appear as a logical LOW to the input comparator 6, thus, under normal circumstances, making the input comparator 6 output a logical LOW level to the control unit 12. The voltage $V_o$ is considered to be equal to the battery voltage when the shift in logical state of the output of the input comparator 6 has taken place, according to the specific circuitry of the hearing aid.

In step 106, a test is performed to verify that a LOW level has indeed been output, as a logically HIGH level under these circumstances signifies an error because the battery voltage $V_{bat}$ is deemed to be above the maximum allowable battery voltage upper limit $V_{UL}$. If the communication line 3 is not logically LOW, the routine continues to step 115, where an error is indicated to the main program. Otherwise, the logical level from the comparator 6 is logically LOW, and a loop comprising steps 107, 113, and 114 is entered.

In step 107, a test is performed to examine if the output of the input comparator 6 has changed to a logical HIGH. If this is not the case, the routine continues to step 113, where the applied voltage $V_o$ is compared to the lowest possible voltage level, in this case, zero volts. If this voltage level has been reached without a shift in logical level taking place, an error has occurred, and the routine continues to step 115 to indicate an error condition. If the lowest possible voltage level has not been reached, the routine continues to step 114, where the voltage $V_o$ is ramped further down. The step size of the ramping depends on the specific implementation of the generator that generates the voltage $V_o$. In a preferred embodiment, this generator is implemented as a D/A converter, easily controllable by the program. Thus, the ramp voltage step size corresponds to the resolution of the particular D/A converter used, or a multiple of this resolution, and may, additionally, be adjusted for offset.

After a ramp step of the voltage $V_o$, the routine returns to step 107 to test the output of the input comparator 6 again. If this has changed to a logical HIGH level due to the decrement of the voltage $V_o$, the routine continues to step 108, where the voltage $V_o$ is compared to the predetermined lower voltage limit $V_{LL}$ above which the hearing aid may safely and reliably be programmed. If the voltage $V_o$ is below the predetermined limit $V_{LL}$, the routine continues to step 109, where a 'battery low' indicator routine is called to indicate that the hearing aid battery has insufficient power for the programming device 2 to be able to perform a reliable programming of the hearing aid, and the routine is terminated in step 111. If, however, the voltage $V_o$ is above the limit $V_{LL}$ when tested in step 108, a 'battery OK' indicator routine is called in step 110 to indicate that a programming of the hearing aid may be safely executed, and the routine is terminated in step 112. The voltage $V_o$ now reflects the voltage of the hearing aid battery.

If a sufficiently powerful voltage source is available, another embodiment of the method of measuring the voltage of the hearing aid according to the invention may be considered, where the voltage $V_o$ starts at a predetermined negative value when compared to the voltage of the hearing aid battery and is ramped upwards until the level of the input comparator 6 changes from a logical HIGH to a logical LOW as the battery voltage level—or a voltage level derived therefrom—is reached. However, this mode of operation requires the availability of a low negative voltage $V_o$ to be able to change the state of the input comparator 6 during ramping, and this negative voltage range may not be present in standard units.

Figure 3:
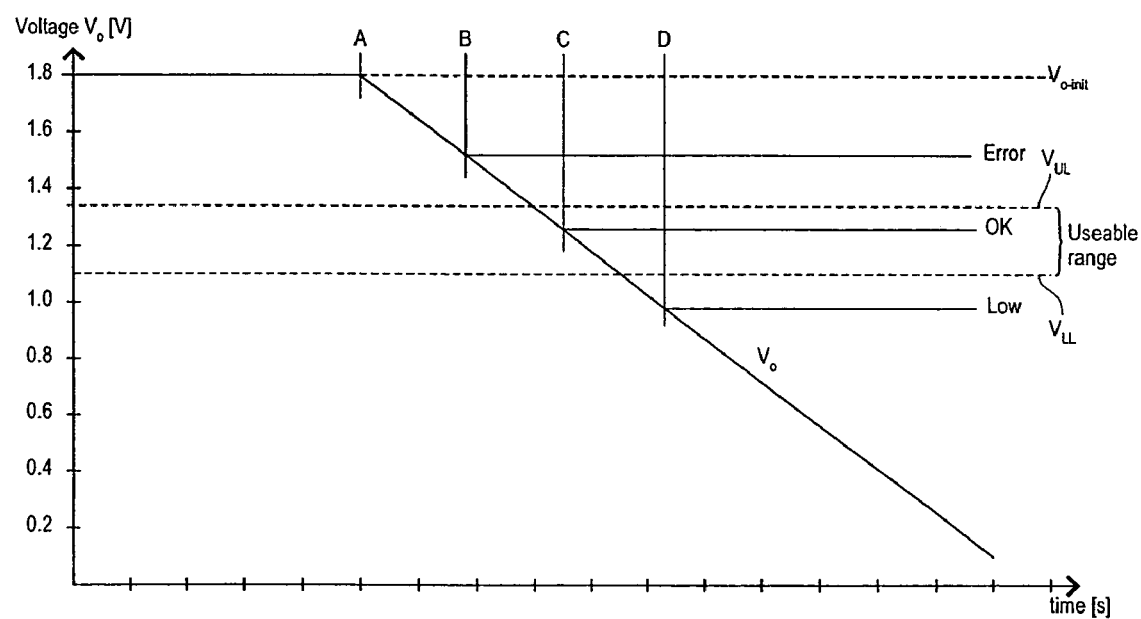
FIG. 3 is a graph showing the evolution of a ramped reference voltage in a preferred embodiment of the invention.

In the graph in FIG. 3, an evolution of the output voltage $V_o$ as a function of time (not to scale) is shown. For instants prior to the time in the point A, $V_o$, is constant, e.g. to permit the programming device to wait for the voltage to stabilize. From point A and onwards, the voltage $V_o$ ramps downwards at a fixed rate. Ramping of the voltage stops when the output of the input comparator 6 changes state from a logical LOW to a logical HIGH.

If ramping of the voltage stops at the point B, where the voltage $V_o$ is above $V_{UL}$, as shown in FIG. 3, an error have occurred as the voltage $V_o$ is above the maximum acceptable battery voltage level range, and an "error" condition is indicated by the programming device. If, on the other hand, the ramping of the voltage $V_o$ continues to the point C, where the voltage $V_o$ is between the upper limit $V_{UL}$ and the lower limit $V_{LL}$, the voltage $V_o$ is within the acceptable range of the battery voltage level, and a "battery OK"-condition is indicated by the programming device. If, however, the ramping of the voltage $V_o$ continues to the point D, where the voltage $V_o$ is below $V_{LL}$, the voltage $V_o$ is below the acceptable range of the battery voltage level, and a "battery low"-condition is indicated by the programming device.

In the preferred embodiment, the ramping of the voltage starts at approximately 1.8 volts, and the acceptable range of the hearing aid battery is from approximately 1.1 to 1.35 volts. This is, incidentally, has been found a useable voltage range of a zinc-air battery for programming.

The invention claimed is:

1. A method of determining the voltage of a battery in a hearing aid, comprising the steps of providing a line connection for connecting the hearing aid to a programming device;

providing in the programming device a variable voltage source and an input comparator;

connecting a first input terminal of the input comparator to the voltage source;

connecting a second input terminal of the input comparator to the line connection;

controlling the voltage source to output a voltage that varies according to a predetermined pattern, by ramping the voltage using a D/A converter;

determining by the programming device the instant of a change at an output of the input comparator; and determining by the programming device as the value of the battery voltage the value of the voltage source output voltage at said instant of a change at the output of the input comparator.

2. The method according to claim 1, comprising detecting the presence of a hearing aid by sending a data telegram from the programming device to the hearing aid and testing for the reception of an acknowledge data telegram from the hearing aid.

3. The method according to claim 1, comprising detecting the presence of a hearing aid by detecting a change in voltage of the second input terminal of the input comparator.

4. The method according to claim 1, wherein the step of controlling the voltage source to output a voltage that varies according to a predetermined pattern comprises applying by means of the voltage source a probe voltage different from the expected battery voltage and ramping the probe voltage up or down.

5. The method according to claim 1, comprising the step of detecting whether the battery voltage is below a predetermined voltage upper limit.

6. The method according to claim 1, comprising the step of detecting whether the battery voltage is above a predetermined voltage lower limit.

7. The method according to claim 1, comprising the step of varying the controllable voltage by outputting initially a voltage at a level above a predetermined upper limit and then ramping the voltage downwards.

8. The method according to claim 1, comprising the step of varying the controllable voltage by outputting initially a voltage at a level below a predetermined lower limit and then ramping the voltage upwards.

9. The method according to claim 1, comprising the step of ramping the voltage in step-wise decrements.

10. A method of programming a hearing aid, comprising the steps of providing a line connection for connecting the hearing aid to a programming device;

providing in the programming device a variable voltage source and an input comparator;

connecting a first input terminal of the input comparator to the voltage source;

connecting a second input terminal of the input comparator to the line connection;

detecting the presence of a hearing aid by sending a data telegram from the programming device to the hearing aid and testing for the reception of an acknowledge data telegram from the hearing aid;

controlling the voltage source to output a voltage that varies according to a predetermined pattern;

determining by the programming device the instant of a change at an output of the input comparator;

determining by the programming device as the value of a battery voltage of the hearing aid the value of the voltage source output voltage at said instant of a change at the output of the input comparator; and writing programming data from the programming device to the hearing aid.

\* \* \* \* \*

UNITED STATES PATENT AND TRADEMARK OFFICE
CERTIFICATE OF CORRECTION

| | | |
|---|---|---|
| PATENT NO. | : 7,639,822 B2 | Page 1 of 1 |
| APPLICATION NO. | : 11/226348 | |
| DATED | : December 29, 2009 | |
| INVENTOR(S) | : Anders Westergaard | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 882 days.

Signed and Sealed this

Ninth Day of November, 2010

David J. Kappos
*Director of the United States Patent and Trademark Office*